(12) United States Patent
Ido et al.

(10) Patent No.: US 7,215,271 B2
(45) Date of Patent: May 8, 2007

(54) METHOD AND APPARATUS FOR FORMING TRANSIENT RESPONSE CHARACTERISTICS

(75) Inventors: Toru Ido, Kanagawa (JP); Soichiro Ishizuka, Kanagawa (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/172,265

(22) Filed: Jun. 29, 2005

(65) Prior Publication Data

US 2006/0017596 A1 Jan. 26, 2006

(30) Foreign Application Priority Data

Jun. 30, 2004 (JP) ............... 2004-193082

(51) Int. Cl.
*H03M 1/66* (2006.01)
(52) U.S. Cl. ...................... 341/144; 341/145
(58) Field of Classification Search ................ 341/144, 341/145, 143; 84/660
See application file for complete search history.

(56) References Cited

U.S. PATENT DOCUMENTS 5,536,903 A * 7/1996 Kitayama et al. ............. 84/660
5,587,711 A * 12/1996 Williams et al. ............. 341/144
6,549,155 B1 * 4/2003 Heminger et al. .......... 341/144

FOREIGN PATENT DOCUMENTS

JP 11-137899 11/2000

OTHER PUBLICATIONS

Carley, Richard L.; *A Noise-Shaping Coder Topology For 15+ Bit Converters*; IEEE Journal of Solid-State Circuits, vol. 24, No. 2, Apr. 1989, pp 267-273.
Leung, Bosco H.; *Architectures For Multi-Bit Oversampled A/D Converter Employing Dynamic Element Matching Techniques*; Dept. of Electrical Engineering; Unviersity of Waterloo, Waterloo, Ontario; IEEE, CH 3006-4/91/0000; pp 1657-1660.
Van De Plassche, Rudy J.; *Dynamic Element Matching For High-Accuracy Monolithic D/A Converters*; IEEE Journal of Solid State Circuits, vol. SC-11, No. 6, Dec. 1976; pp 795-800.

* cited by examiner

*Primary Examiner*—Jean Bruner Jeanglaude
(74) *Attorney, Agent, or Firm*—William B Kempler; W. James Brady; Frederick J. Telecky, Jr.

(57) ABSTRACT

Transient response generating circuit A has a first circuit 3 that generates transient response OUT1 in a first polarity direction, a second circuit 4 that generates transient response OUT2 in a second polarity direction opposite to the first polarity, and a transient response synthesizing circuit 6 that combines the transient response OUT1 in the first polarity direction and the transient response OUT2 in the second polarity direction to generate composite transient response OUTC.

10 Claims, 9 Drawing Sheets

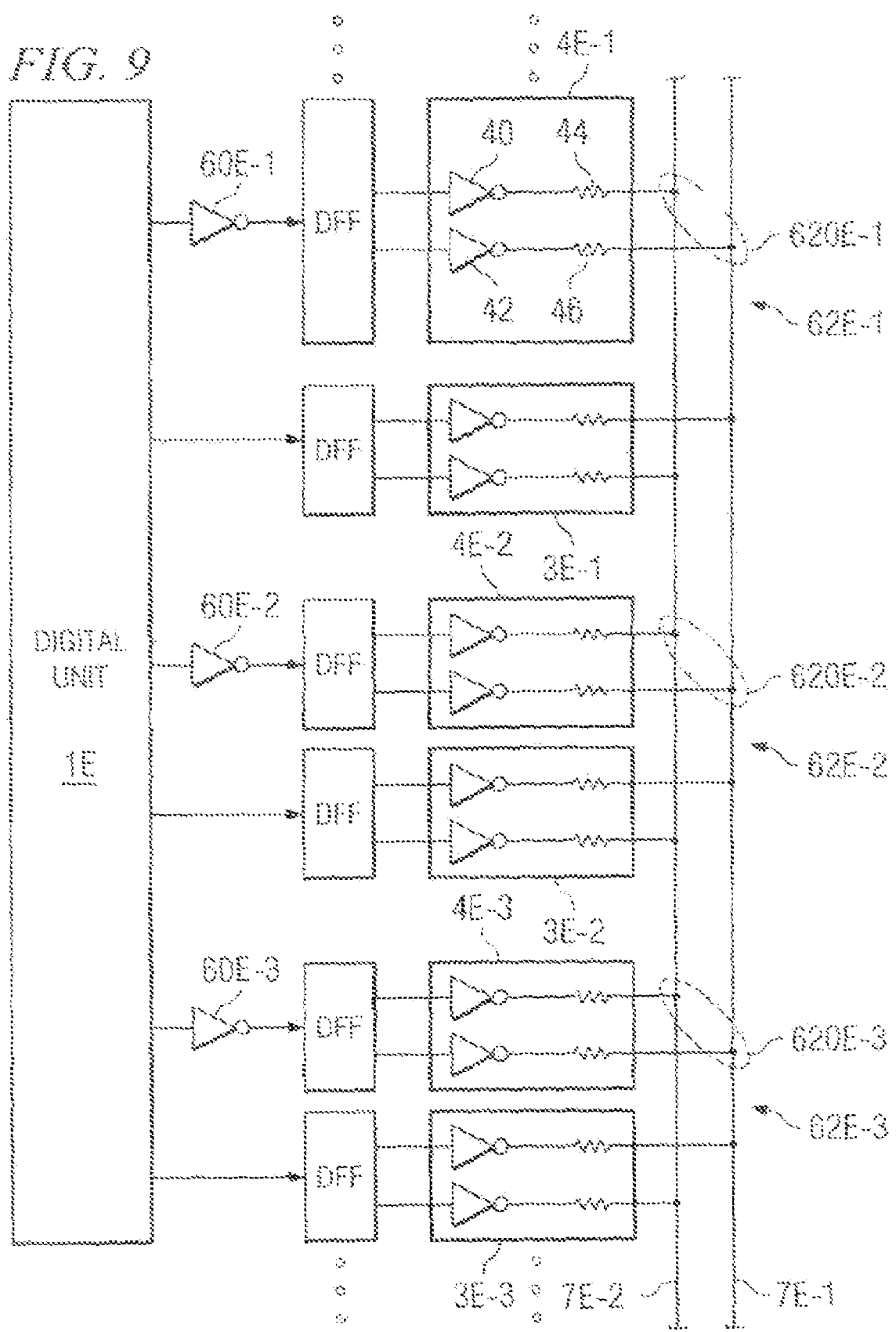

METHOD AND APPARATUS FOR FORMING TRANSIENT RESPONSE CHARACTERISTICS

FIELD OF THE INVENTION

The present invention pertains to a method and device for forming transient response characteristics of circuit devices including op-amps, digital-analog (D/A) converters (DAC), and other electrical circuits. In particular, the present invention pertains to a method and device used to reduce the transient response error of these circuit devices.

BACKGROUND OF THE INVENTION

FIG. 1 is a block diagram illustrating an example of a conventional segment DAC. This segment DAC is comprised of any number of segments, and the same number of D-type flip-flops (DFF). Each of the segments included in the DAC receives a 1-bit signal from the Q output and Q* (* means inversion) output of a DFF from the digital part. According to that 1-bit signal, each segment outputs a signal of "+1" or "−1" in the form of a differential signal (positive output and negative output). The positive output and negative output that constitute each differential output obtained from these segments are added to each other by being connected to a positive output line and a negative output line, respectively. An analog output is obtained as a result.

FIG. 2 shows the output waveform of one segment in the segment DAC having the aforementioned configuration. The upper part in FIG. 2 shows the ideal waveform, while the lower part in FIG. 2 shows the actual output waveform. As shown in the upper part in FIG. 2, it is ideal for the output of the segment DAC that the value changes instantaneously without accompanying the transient response. In the actual circuit, however, it is difficult to realize that characteristic. As shown in the lower part in FIG. 2, in the DAC output, the output value varies in conjunction with the transient response. In the case of the actual circuit, if the rising transient response when the value changes from "−1" to "+1" and the falling transient response when the value changes from "+1" to "−1" are completely consistent with each other, the performance of the DAC will not be affected. In the actual circuit, however, the influence of the circuit configuration of each segment and mismatches of the circuit elements used causes differences to occur between the rising transient response characteristic and the falling transient response characteristic, and such differences will aggravate the distortion of the DAC. Consequently, when such a configuration is adopted, a proper circuit design is required in order to reduce the mismatching that causes the differences in the transient response of each segment.

In one of the conventional circuit design methods for reducing such mismatching, the areas of transistors, resistors, or other circuit elements included in each said segment are increased to reduce the dimensional error of each circuit element. When using this method, however, a very large circuit area is required to realize each segment. Also, the area of the IC chip used for the DAC will be increased.

Another circuit technology for reducing mismatching uses a correcting current source for example, Japanese Kokai Patent Application No. 2000-332610. In this method, a correcting current source is adopted in a current adding type D/A converter in order to reduce the secondary distortion caused by the difference between the rising and falling rates of the converter output voltage. The correcting current source supplies a correcting current temporarily in order to speed up the slow rising rate. A circuit used to detect the change point of the digital input value is also adopted in order to control supply of the correcting current from the correcting current source. Consequently, in this method, in order to generate a highly-accurate output, it is necessary to use accurate circuits such as the correcting current source and the change point detecting circuit in order to increase the accuracy. As a result, the circuit configuration becomes complicated, and the circuit area is increased.

The aforementioned transient response error also occurs in many other electrical circuits or circuit devices besides the DAC.

SUMMARY OF THE INVENTION

A general object of the present invention is to provide a method and device for forming transient response characteristics that can reduce the transient response error.

This and other objects and features are attained, in accordance with one object of the present invention by a method for forming transient response characteristics which combines the transient response characteristic in a first polarity direction of a circuit and the transient response characteristic in a second polarity direction opposite to the aforementioned first polarity of the aforementioned circuit to form a composite transient response characteristic.

According to a second aspect of the present invention, the method for forming transient response characteristics can have a step of generating the transient response in the first polarity direction of the aforementioned circuit and the transient response in the second polarity direction opposite to the aforementioned first polarity and a step of combining the transient responses in the aforementioned first and second polarity directions to generate a composite transient response. The aforementioned transient response generating step can include a step of generating the transient response in the aforementioned first polarity direction in a first circuit used as the aforementioned circuit and a step of generating the transient response in the aforementioned second polarity direction in a second circuit that is virtually equivalent to the aforementioned first circuit and is used as the aforementioned circuit. Also, the transient response characteristic of the aforementioned first circuit may have virtually the same tendency regarding the error between the transient response in the first polarity direction and the transient response in the second polarity direction as the transient response characteristics of the aforementioned second circuit. The aforementioned composite transient response characteristic may have virtually equivalent transient response characteristic in the first and second polarity directions so that the error between the transient responses in the first and second polarity directions of the aforementioned circuit can be reduced. The aforementioned first and second circuits can also be different from each other. The transient response in the aforementioned first polarity direction may be either a rising transient response or a falling transient response, while the transient response in the aforementioned second polarity direction is the other transient response.

According to the third aspect of the present invention, the method for generating the transient response of a circuit disclosed in the present invention has a step of generating the transient response in a first polarity direction of the aforementioned circuit and the transient response of a second polarity direction opposite to the aforementioned first polarity and a step of combining the transient response in the first polarity direction and the transient response in the second polarity direction to generate a composite transient response.

According to a fourth aspect of the present invention the method for reducing the error in the response of a circuit device has, the transient response characteristic in a first polarity direction of the response of the circuit device and the transient response characteristic in a second polarity direction opposite to the first polarity are each formed by combining the transient response characteristics in the first and second polarity directions of a prescribed circuit element in the aforementioned circuit device.

According to a fifth aspect of the present invention the transient response generating circuit has a first circuit that generates the transient response in a first polarity direction, a second circuit that generates the transient response in a second polarity direction opposite to the aforementioned first polarity, and a transient response synthesizing circuit that combines the transient responses in the aforementioned first and second polarity directions to generate a composite transient response.

According to a sixth aspect of the present invention, in the aforementioned transient response generating circuit, the aforementioned first and second circuits can be virtually equivalent to each other. Also, each of the aforementioned first and second circuits can be any circuit among plural circuits that are virtually equivalent to each other. The transient response characteristic of the aforementioned first circuit has virtually the same tendency regarding the error between the transient response in the first polarity direction and the transient response in the second polarity direction as the transient response characteristic of the aforementioned second circuit. In this case, the aforementioned composite transient response characteristic may have virtually equivalent transient response characteristics in the first and second polarity directions so that the error between the transient responses in the first and second polarity directions of the aforementioned circuit can be reduced.

Also, according to a seventh aspect of the present invention, the aforementioned first circuit can generate a first output in response to a first input, and the first output has the transient response in the aforementioned first polarity direction. The aforementioned second circuit can generate a second output in response to a second input obtained by inverting the aforementioned first input. The second output has the transient response in the aforementioned second polarity direction. In this case, the aforementioned transient response generating circuit also has an inverting circuit used for inverting the aforementioned first input to generate the aforementioned second input. In this way, the aforementioned second input can be applied to the aforementioned second circuit at the same time that the aforementioned first input is applied to the aforementioned first circuit.

According to the eighth aspect of the present invention, the transient response in the aforementioned first polarity direction can be either a rising transient response or falling transient response, while the transient response in the aforementioned second polarity direction is the other transient response. The aforementioned first and second circuits can be different from each other. Also, the aforementioned transient response synthesizing circuit can be a subtracting circuit used for calculating the difference between the first and second outputs.

According to a ninth aspect of the present invention, the differential circuit disclosed in ut, a second circuit that receives a second input formed by inverting the aforementioned first input and generates a second output, this second circuit being virtually equivalent to the aforementioned first circuit, and a subtracting circuit that calculates the difference between the first and second outputs. According to the present invention, the aforementioned first and second circuits can be different from each other. Also, the aforementioned first input is comprised of a first pair of differential inputs. The aforementioned second input is comprised of a second pair of differential inputs. The aforementioned first output is comprised of a first pair of differential outputs. The aforementioned second output is comprised of a second pair of differential outputs. The aforementioned second pair of differential inputs is obtained by reversing the aforementioned first pair of differential inputs. The aforementioned subtracting circuit can be formed by connecting the aforementioned first pair of differential outputs to the aforementioned second pair of differential outputs in opposite polarities.

The circuit device according to a tenth aspect the present invention has A) a first circuit which is a first circuit generating a first output in response to a first input with the aforementioned first output having prescribed transient response characteristics in a first polarity direction and a second polarity direction, B) an error reducing circuit that reduces the transient response error in the aforementioned first output of the aforementioned first circuit to generate an error-reduced output.

According to an eleventh aspect of the present invention, the transient response characteristics in the first and second polarity directions of the aforementioned error-reduced output can be virtually equivalent to each other. Also, the transient response characteristic in the aforementioned first polarity direction and the transient response characteristic in the aforementioned second polarity direction of the aforementioned error-reduced output can each be the combination of the transient response characteristic in the aforementioned first polarity direction and the transient response characteristic in the aforementioned second polarity direction of the aforementioned first circuit. The aforementioned error reducing circuit can be connected properly to receive the aforementioned first input and the first output of the aforementioned first circuit. In this case, the aforementioned error reducing circuit can have A) a second circuit that receives a second input and generates a second output, this second circuit being virtually equivalent to the aforementioned first circuit and B) a matching circuit that is connected to the aforementioned first and second circuits and generates the aforementioned error-reduced output by matching the transient response characteristics. The aforementioned error-reduced output has matched transient response characteristics in the first and second polarity directions. The aforementioned matching circuit can also have A) an inverting circuit that inverses the aforementioned first input to generate the aforementioned second input and B) a synthesizing circuit that combines the aforementioned first and second outputs to generate the aforementioned error-reduced output. The aforementioned first input is applied to the aforementioned first circuit to generate the aforementioned first output. The aforementioned second input is applied to the aforementioned second circuit to generate the aforementioned second output. In this way, one of the transient responses in the aforementioned first and second polarity directions of one the aforementioned first and second circuits can be generated at the same time with the other transient response among the transient responses in the aforementioned first and second polarity directions of the other circuit among the aforementioned first and second circuits.

According to a twelfth aspect of the present invention, the aforementioned circuit device can constitute any two weighting elements among the plural weighting elements in a D/A converter, and the aforementioned first and second circuits constitute the weighting circuit of each of the aforementioned weighting elements. The aforementioned any two weighting elements can be selected from the aforementioned plural weighting elements using a prescribed method.

According to a thirteenth aspect of the present invention, the aforementioned circuit device can also constitute one of plural weighting elements in a D/A converter, and the aforementioned first and second circuits constitute the weighting circuit of each of the aforementioned weighting elements. In this case, the aforementioned weighting circuit can have a current source or a voltage source. Also, the aforementioned plural weighting elements can be a group of weighting elements that generate weights of the same magnitude among plural weighting elements that generate weights in different magnitudes.

According to the fourteenth aspect of the present invention, the aforementioned circuit device may have a differential circuit configuration or a single-ended circuit configuration.

According to a fifteenth aspect of the present invention, the D/A converter disclosed in the present invention has A) plural weighting elements used for converting a digital signal into an analog signal and B) a digital processing circuit that generates plural binary signals to be applied to the aforementioned plural weighting elements from the aforementioned digital signal. Any two of the aforementioned plural weighting elements are comprised of the aforementioned circuit device.

According to a sixteenth aspect of the present invention, the D/A converter disclosed in the present invention may have A) plural weighting elements used for converting a digital signal into an analog signal and B) a digital processing circuit that generates plural binary signals to be applied to the aforementioned plural weighting elements from the aforementioned digital signal. Each of the aforementioned plural weighting elements is comprised of the aforementioned circuit device.

According to a seventeenth aspect of the present invention, in the aforementioned D/A converter, the aforementioned weighting element can be constituted with a current source or a voltage source. The aforementioned D/A converter can use weights of the same magnitude, and each of the aforementioned plural weighting elements of the aforementioned D/A converter generates the weight of the aforementioned same magnitude. In this case, the aforementioned digital processing circuit may include a rotation circuit that selects the binary signals to be applied to the aforementioned plural weighting elements from the aforementioned plural binary signals using a prescribed method.

Also, according to an eighteenth aspect the present invention, in the aforementioned D/A converter, the aforementioned D/A converter can use weights of different magnitudes, and the aforementioned plural weighting elements of the aforementioned D/A converter include plural weighting elements with respect to each of the weights. In this case, the aforementioned digital processing circuit may include a rotation circuit that selects the binary signals to be applied to the aforementioned plural weighting elements from the aforementioned plural binary signals using a prescribed method. Also, the aforementioned rotation circuit may include a rotation circuit that selects the binary signals to be applied to the plural weighting elements with respect to the plural different weights from the aforementioned plural binary signals using a prescribed method.

BRIEF DESCRIPTION OF THE DRAWINGS

FIG. 9 is a block diagram illustrating inverter D/A converter E in an embodiment that further embodies the segment D/A converter shown in FIG. 6.

REFERENCE NUMERALS AND SYMBOLS AS SHOWN IN THE DRAWING

In the figures, A represents a transient response generating circuit, B a circuit device, C a segment D/A converter, D a current segment D/A converter, E an inverter D/A converter, F a segment D/A converter, G a binary weighted D/A converter, H a partially segmented D/A converter, J an op-amp circuit, M a Gilbert mixer circuit, 1 an input terminal, 1C a digital part, 12F an element rotation circuit, 2 an input terminal, 3 a transient response generating circuit in the first polarity direction, 3B a first circuit, 4 a transient response generating circuit in the second polarity direction, 4B a second circuit, 3C-1 to 3, 4C1-4 segments, 3D-1 to 3, 4D-1 to 3 current segments, 3E-1 to 3, 4E-1 to 3 segments, 3J, 4J op-amps, 3J, 4J OTAs, 3L, 4L charge pumps, 3M, 4M Gilbert mixers, 5 a transient response error reducing circuit, 6 a transient response synthesizing circuit, 6B a matching circuit, 60B an inverter, 60C-1 to 4 inverters, 60J an inverse connection, 62B a synthesizing circuit, 62C-1 a subtracting circuit, 62J an inverse connection, 620C-1 an inverse connection, 7 an output terminal, and 7C-1, 7C-2 differential output lines.

DESCRIPTION OF THE EMBODIMENTS

According to the present invention, transient response characteristics with reduced transient response error can be formed. The offset caused by the transient response error can also be reduced. Also, according to the present invention, the distortion performance of D/A converters can be improved. In the case of a D/A converter having plural segments, the transient response error can be reduced so that the distortion performance can be improved without increasing the number of segments. Consequently, a desired distortion performance can be realized using a circuit area smaller than the area required in the conventional technology to improve the distortion performance. In addition, by matching the rising and falling transient responses, the transient response error can be reduced more easily than in the conventional technology. In other words, the transient response error can be reduced very easily by using at least two identical circuits instead of by adding complicated circuits for error reduction as in the conventional technology. Moreover, in a circuit device having plural identical circuit elements, since error reduction can be realized by simply reversing the logical values of the signals applied to the circuit elements and inverting the differential outputs from the circuit elements, the present invention can be applied easily to existing circuits.

In the following, various embodiments of the present invention will be explained in detail with reference to figures.

Figure 3:
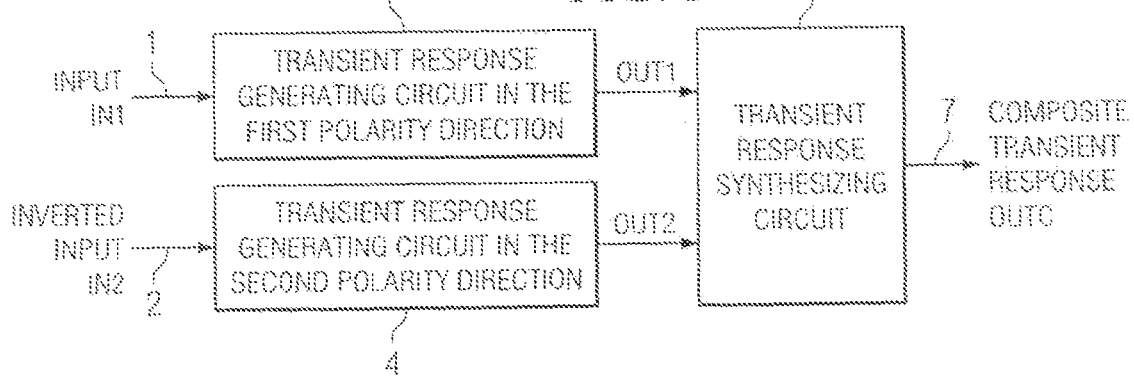
FIG. 3 is a block diagram illustrating transient response generating circuit A disclosed in the present invention.

First, FIG. 3 is a block diagram illustrating transient response generating circuit A disclosed in the present invention. Said transient response generating circuit A has input terminal 1 for receiving input IN1, input terminal 2 for receiving input IN2, first polarity direction transient response generating circuit 3 for generating the transient response in the first polarity direction, second polarity direction transient response generating circuit 4 for generating the transient response in the second polarity direction, transient response synthesizing circuit 6 for synthesizing the transient responses, and output terminal 7 that outputs composite transient response output OUTC when said synthesizing circuit 6 synthesizes output OUT1 sent from generating circuit 3 and OUT2 sent from generating circuit 4.

Figure 4A:
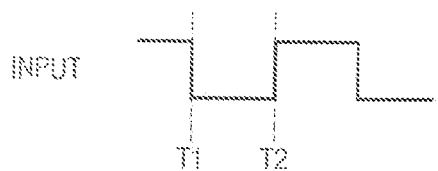
FIG. 4 is a waveform diagram illustrating the waveform of each part in transient response generating circuit A shown in FIG. 3.
Figure 4B:
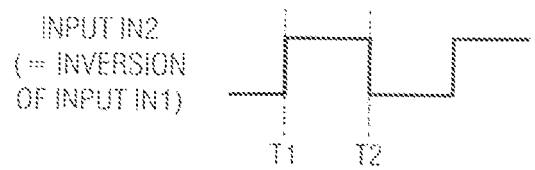
Figure 4C:

As shown in FIG. 4, generating circuit 3 receives input IN1 (FIG. 4(a)) and generates transient response output OUT 1 in the first polarity direction (FIG. 4(c)). On the other hand, generating circuit 4 receives input IN2 (FIG. 4(b)) obtained by inverting input IN1 and generates transient response output OUT2 in the second polarity direction (FIG. 4(d)). In the example shown in FIG. 4, both inputs IN1 and IN2 are shown as sharply, that is, instantaneously rising and falling inputs. In this case, the first and second polarity directions are not definite polarity directions. Instead, the first polarity direction refers to a rising direction from negative to positive or to a falling direction from positive to negative. The second polarity direction is the falling direction if the first polarity direction is the rising direction or the rising direction if it is the falling direction. Consequently, generating circuits 3 and 4 generate not only rising transient response output but also falling transient response output. Synthesizing circuit 6 receiving said transient response outputs OUT1 and OUT2 synthesizes these outputs to generate composite transient response output OUTC (FIG. 4(g)). More specifically, for example, synthesizing circuit 6 calculates the difference between transient response outputs OUT1 and OUT2. The calculation result of (OUT2−OUT1) is output as composite output OUTC (FIG. 4(g)). Also, in FIG. 4, since subtraction is shown as adding for easy understanding, OUT1* obtained by inverting OUT1 (FIG. 4(e)) and OUT2 (FIG. 4(f)) are shown above and below composite output OUTC.

Figure 4D:
Figure 4E:
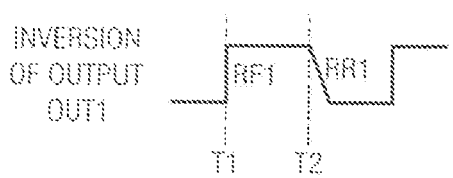
Figure 4F:
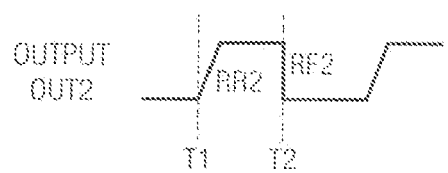

In this case, generating circuits 3 and 4 are assumed to have virtually the same or similar transient response characteristics, that is, sharp falling response characteristic and less sharp rising response characteristic. In this case, as shown in FIG. 4(c), generating circuit 3 generates transient response output OUT1, which has sharp falling response Rf1 at time t1 in response to input IN1 and then has less sharp rising response Rr1 at time t2. On the other hand, as shown in FIG. 4(d), generating circuit 4 generates transient response output OUT2 (FIG. 4(d)), which has slow rising response Rr2 at time t1 in response to input IN2 obtained by inverting input IN1 and then has sharp falling response Rf2 at time t2. That is, transient responses in opposite polarity directions are generated simultaneously such that at time t1 a falling response is generated by generating circuit 3 and a rising response is generated by generating circuit 4, and at time t2 a rising response is generated by generating circuit 3 and a falling response is generated by generating circuit 4.

Figure 4G:
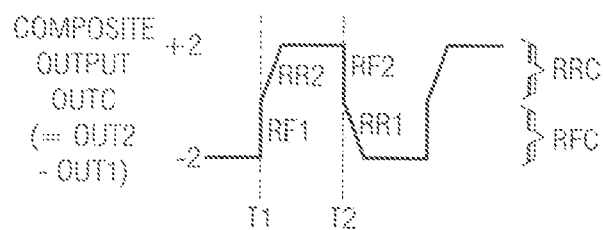

As shown in FIG. 4(g), synthesizing circuit 6 receiving said outputs OUT1 and OUT2 generates composite transient response output OUTC, which has composite rising response Rrc at time t1 and then has composite falling response Rfc at time t2. More specifically, composite rising response Rrc is the combination of the falling response Rf1 of OUT1 and the rising response Rr2 of OUT2. On the other hand, composite falling response Rfc is the combination of the falling response Rf2 of OUT2 and the rising response Rr1 of OUT1. As shown in the figure, if generating circuits 3 and 4 are virtually equivalent circuits, in other words, if at least the transient response characteristics, that is, rising transient responses Rr1 and Rr2 are virtually equivalent to each other and the falling transient responses Rf1 and Rf2 are virtually equivalent to each other, the characteristics of the rising and falling transient responses of composite output OUTC are virtually equivalent to each other. As a result, the transient response error, that is, the error between the rising and falling transient responses of composite output OUTC becomes virtually zero. Also, the transient response error of composite output OUTC is low if generating circuits 3 and 4 have similar transient response characteristics. If these circuits have virtually the same transient response characteristics, as shown in FIG. 4, the error becomes zero as described above.

Also, in the example shown in FIG. 4, the rising response is less sharp than the falling response. The relationship between the responses can also be reversed. In this case, the transient response error can be reduced in the same way as described above. In this case, the degree of matching between the rising and falling transient responses of the composite transient response is dependent on the transient response characteristics of the two transient response generating circuits 3 and 4. If the degree of matching of the transient response characteristics between generating circuits 3 and 4 is high, the degree of matching of the composite transient response is also high. Consequently, in order to increase the degree of matching of the composite transient response, it is preferred to use virtually the same circuits as the generating circuits 3 and 4.

In the following, the circuit device B in one embodiment of the transient response characteristic forming circuit shown in FIG. 3 will be explained with reference to FIG. 5. Also, the symbol "B" is attached to the same element reference numbers as those used for the elements shown in FIG. 3. As shown in the figure, circuit device B can reduce the transient response errors of the circuit elements included in this circuit device. More specifically, circuit device B has input terminal 1B receiving input IN1, a first circuit 3B acting as the main circuit connected by its input to said terminal 1B, transient response error reducing circuit 5 used to reduce the transient response error of the main circuit, and output terminal 7B that generates OUTCB with error reduced by error reducing circuit 5. Also, the first circuit 3B is the circuit element whose transient response error is reduced by said circuit device B. Error reducing circuit 5 is connected to input terminal 1B and the output of the first circuit 3B. It has matching circuit 6B used for matching the rising and falling transient responses of circuit device B and a second circuit 4B used for matching. The second circuit 4B acts as a secondary circuit with respect to the first circuit 3B, which is the main circuit. Also, matching circuit 6B has inverter 60B with its input connected to input terminal 1B, and synthesizing circuit 62B having inputs that receive the output from the first circuit 3B and the output from the second circuit 4B. The second circuit 4B receives input IN2 obtained by inverting input IN1 in inverter 60B, and generates corresponding output OUT2B. Similarly, the first circuit 3B receives input IN1 and generates corresponding output OUT1B. A circuit having virtually the same or similar transient response characteristic as that of the first circuit 3B is used as the second circuit 4B. Also, a simple subtracting circuit can be used as synthesizing circuit 62B.

In the following, the operation of circuit device B with the aforementioned configuration will be explained. The first circuit 3B and the second circuit 4B have virtually the same or similar transient response characteristics. Also, since the inputs sent into these circuits are inverted with respect to each other, like the circuit shown in FIG. 3, when the first circuit 3B has a rising response, the second circuit 4B has a falling response and vice versa. Therefore, the output OUT1B of the first circuit 3B and the output OUT2B of the second circuit 4B received by synthesizing circuit 62B have the same waveforms as shown in FIGS. 4(c) and (d), respectively. As a result, when synthesizing circuit 62B performs synthesis, that is, subtraction in the same way as in the circuit shown in FIG. 3, the output has the same waveform as shown in FIG. 4(g), that is, the composite rising transient response and the composite falling transient response vary with virtually the same response characteristic. In this way, the error in the rising and falling transient responses of the first circuit 3B as the main circuit in circuit device B can be reduced by matching the rising and falling transient responses of the output of the synthesizing circuit.

In the following, an embodiment of segment D/A converter C, to which the present invention explained based on FIGS. 3 and 5 has been applied, will be explained with reference to FIG. 6. Also, the symbol "C" is attached to the same element reference numbers as those used for the elements shown in FIGS. 3 and 5. In said D/A converter C, each segment as a weighting element can generate the same weight. As shown in the figure, segment D/A converter C is almost the same as the conventional converter shown in FIG. 1. The difference is that an inverter is used for every other segment, and the differential output of a segment with an inverter is output via an inverse connection. More specifically, as in the conventional circuit shown in FIG. 1, segment D/A converter C has digital unit 1C, plural segments 3C-1 to 3 and 4C-1 to 4, a pair of differential output lines (positive line 7C-1 and negative output line 7C-2), and the same number of D-type flip-flops (DFF) as there are segments. The same circuit elements as those in the conventional circuit have the same respective functions. That is, digital unit 1C generates a 1-bit signal to be converted into a weight by the corresponding segment for each of the plural outputs. A DFF receiving that 1-bit signal outputs that 1 bit and the inverted 1 bit as Q and Q*. Each segment having a pair of differential inputs (+) and (−) receiving the aforementioned outputs can be constituted with a current source and a differential switch or a pair of voltage sources. Then, the weighted output (equal between the segments) corresponding to the signals received at the differential inputs is generated between the differential outputs (+) and (−).

As described above, the difference between segment D/A converter and the conventional circuit is that each of inverters 60C-1 to 4, etc. is connected to one segment (4C-1 to 4, etc.) out of two adjacent segments (4C-1 and 3C-1, 4C-2 and 3C-2, 4C-3 and 3C-3, etc.). The other difference is that the outputs of two adjacent segments are connected to the differential output lines via subtracting circuits 62C-1 to 3. That is, using subtracting circuit 62C-1 for the adjacent pair of segments 4C-1 and 3C-1, segment 3C-1 has the regular connection, that is, the same-polarity connection with its positive output connected to positive output line 7C-1 and its negative output connected to negative output line 7C-2, while segment 4C-1 has inverse connection 620C-1, that is, the opposite-polarity connection with its positive output connected to negative output line 7C-2 and its negative output connected to positive output line 7C-1. Subtracting circuit 62C-1 is realized by combining the regular connection with inverse connection 620C-1. Also, since the inverter is combined with the inverse connection, the magnitude of the analog output of the D/A converter is the same as that of the conventional circuit. The difference is that when one of two adjacent segments has rising response, the other segment has falling response.

Figure 1:
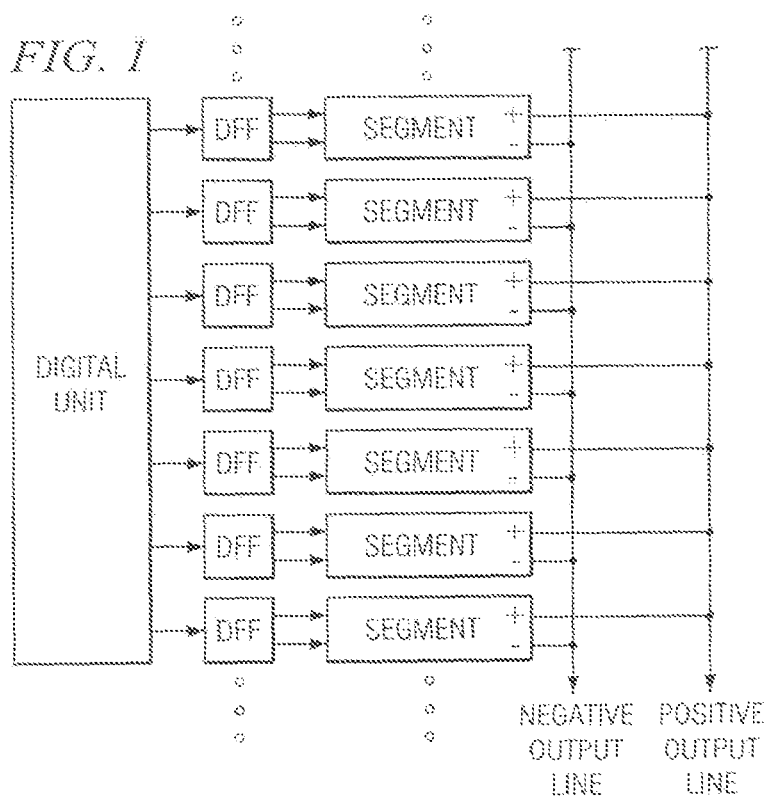
FIG. 1 is a block diagram illustrating an example of the conventional segment D/A converter.
Figure 2:
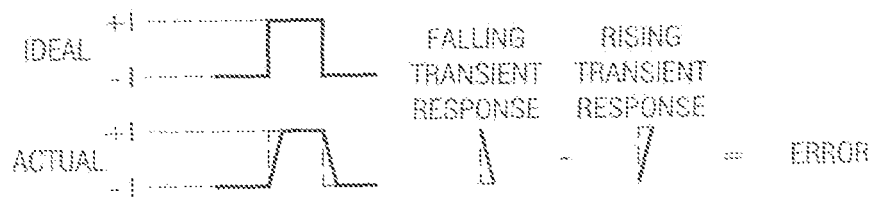
FIG. 2 is a waveform diagram illustrating the output waveform of one segment in the conventional segment D/A converter shown in FIG. 1. It is a diagram used to explain the transient response error.

In the following, the operation of segment D/A converter C shown in FIG. 6 will be explained with reference to FIG. 7 in comparison with the conventional segment DAC shown in FIG. 1. FIG. 7 shows the operation of an adjacent segment pair. When signal of (a) is input into the conventional segment DAC, a signal with the same waveform as the input signal is supplied to each DFF. Then, outputs with the same transient characteristics (slow rising and sharp falling transient characteristics) as shown in (d) and (e) are generated by each segment. The transient characteristics have no change at all in waveform (f) even after addition. Therefore, a large distortion occurs due to the difference between the rising and falling rates. On the other hand, as shown in FIG. 4, with the configuration of the present invention shown in FIG. 6, since one of the signals is inverted with respect to input waveform (g) immediately before the DFF, the signals shown in (h) and (i) are obtained. If the DFF and segment have exactly the same characteristics as those in the conventional circuit, the outputs of each segment become the waveforms shown in (j) and (k). When a falling response is generated at one of the outputs, a rising response is generated at the other output. When (j) and (k) are inverted and added, that is, are subtracted, the waveform shown in (I) is obtained. The transient response from "−2" to "+2" and the transient response from "+2" to "−2" are exactly equivalent.

Figure 6:
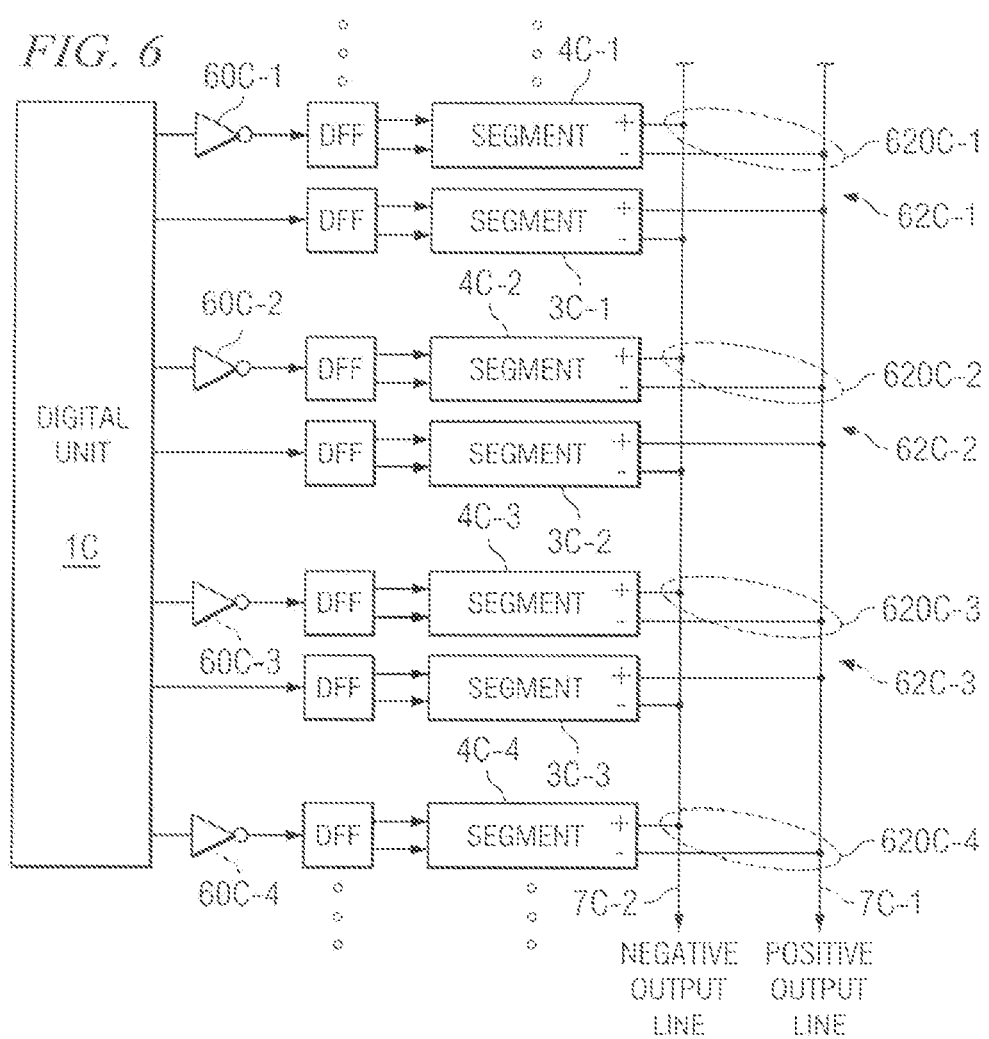
FIG. 6 is a block diagram illustrating segment D/A converter C in an embodiment that applies the present invention explained on the basis of FIGS. 3 and 5.
Figure 7A:
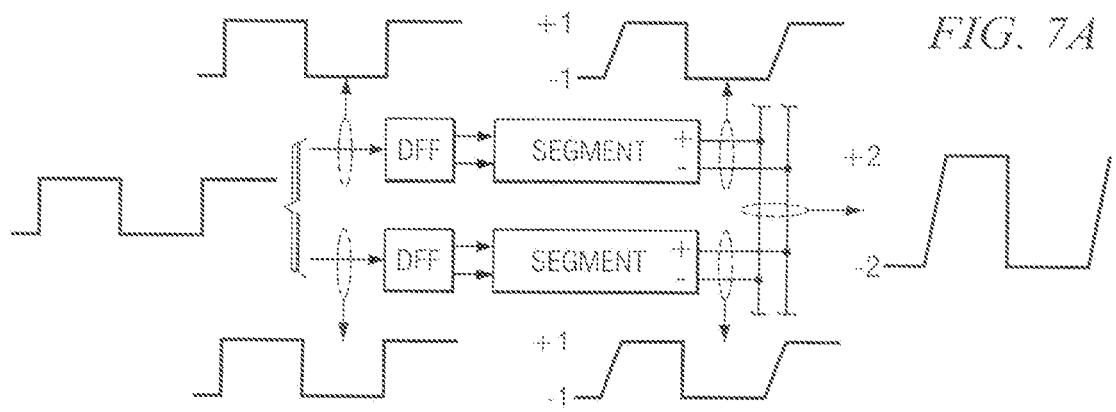
FIG. 7 is a waveform diagram illustrating the waveform of each part in segment D/A converter C shown in FIG. 6, in comparison with the conventional segment D/A converter shown in FIG. 1.
Figure 7B:
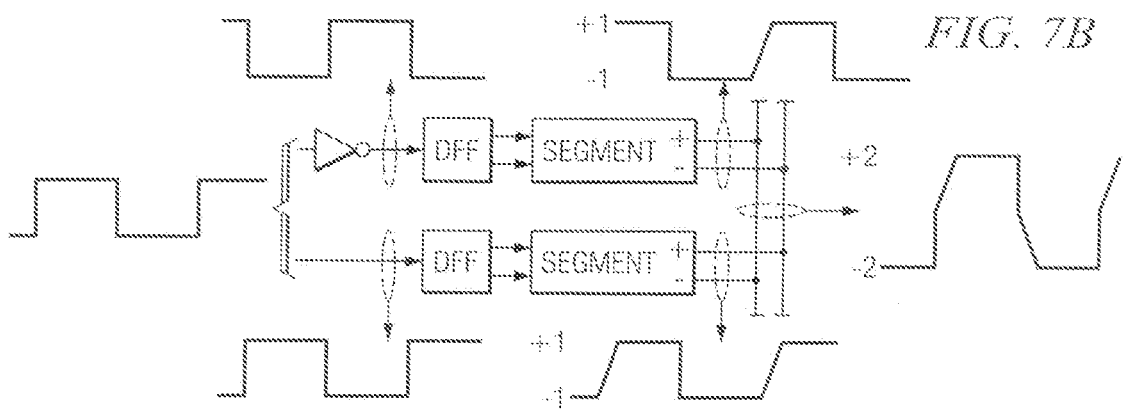

Consequently, in the configuration of the present invention shown in FIG. 6, if the adjacent segments have the same or similar characteristics, no distortion or almost no distortion will occur irrespective of the characteristics of these segments. Also, as far as the sameness or similarity of each segment is concerned, experience shows that when plural segments are assembled on the same IC chip, these segments tend to have similar transient response characteristics, and such a tendency is particularly strong between adjacent circuits. Consequently, segments having virtually the same or similar transient response characteristics as shown in FIG. 6 can also be realized using an integrated circuit. As described above, according to the circuit configuration shown in FIG. 6, in order to realize the present invention in a circuit device having plural circuits that are virtually the same, it is necessary only to perform inverse connection to a number of inverters that is half the number of identical circuits. These inverters can be omitted if they can be substituted for by the existing circuits in the circuit device. Also, the inverse connection can be realized by simply reversing the connection in the case of a differential output configuration without adding a circuit element. In this case, the present invention shown in FIG. 6 can be realized without using any additional circuits at all. Therefore, the circuit scale and circuit area will not be increased. Also, in the example shown in FIG. 6, inverter and inverse connection are applied to every other segment. However, there is no need to apply an inverter and inverse connection to every other segment. They can be applied to any segment as long as they are used for half of the segments (for example, they can be applied to every two pairs or to half of the entire segments).

Figure 8:
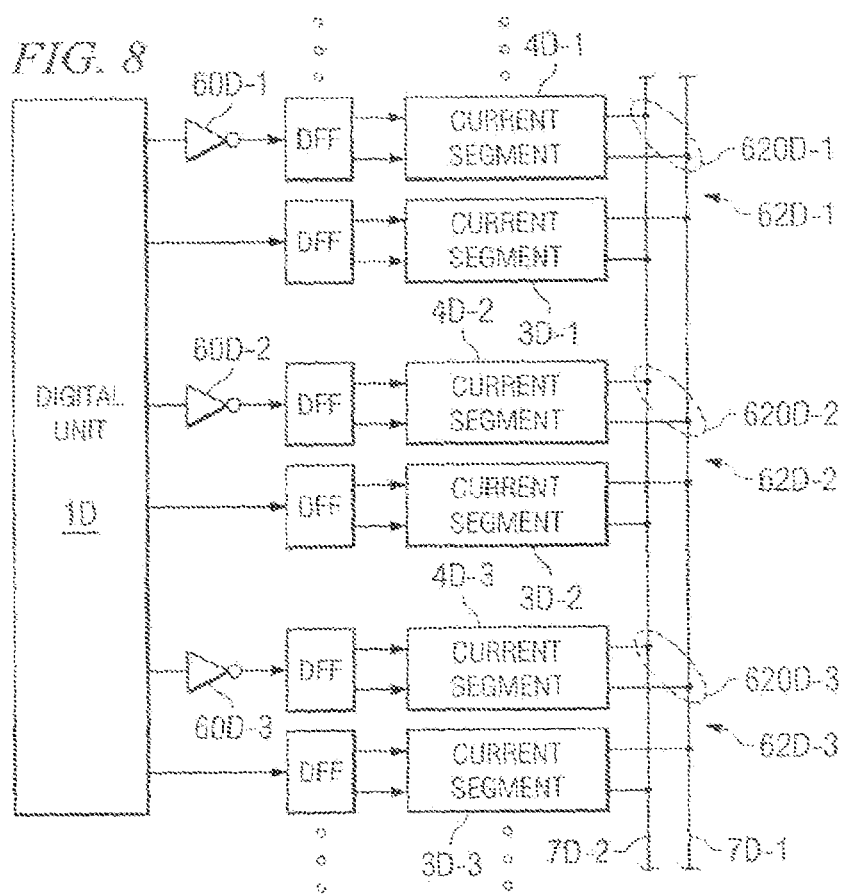
FIG. 8 is a diagram illustrating current segment D/A converter D in an embodiment that further embodies the segment D/A converter shown in FIG. 6.

In the following, a current segment D/A converter D of an embodiment that further embodies the segment D/A converter shown in FIG. 6 will be explained with reference to FIG. 8. In FIG. 8, the symbol "D" is attached to the same element reference numbers as those used for the elements of the converter shown in FIG. 6. More specifically, the only difference is that current segments 3D-1 to 3 and 4-D-1 to 3, etc., are used as segments in FIG. 8, while digital unit 1D, D-type flip-flops DFF, inverters 60D-1 to 3, etc., subtracting circuits 62D-1 to 3 including inverse connections 620D-1 to 3, and differential output lines 7D-1 and 7D-2 are the same as those shown in FIG. 6. In other words, although not shown in the figure, each segment is realized by a well-known circuit configuration comprised of a current source and a differential switch. Since a highly-accurate current segment is usually constituted using a differential switch, the configuration proposed in the present invention can be realized by inverting and connecting a pair of differential outputs as shown in FIG. 8. As described above, the effect of the present invention can be achieved in the same way even if each segment generates the weighted output as current.

In the following, a current segment D/A converter E of an embodiment that further embodies the segment D/A converter shown in FIG. 6 will be explained with reference to FIG. 9. In FIG. 9, the symbol "E" is attached to the same element reference numbers as those used for the elements shown in FIG. 6. The difference from the current segment D/A converter D shown in FIG. 8 is that in the D/A converter E shown in FIG. 9, each of segments 3E-1 to 3 and 4E-1 to 3 is an inverter type segment that generates the weighted output in the form of voltage. Consequently, as shown in the figure, each segment is comprised of a pair of elements, that is, inverter 40 or 42 and resistor 44 or 46 that act as a voltage source. Digital unit 1E, flip-flops DFF, inverters 60E-1 to 3, etc., subtracting circuits 62E-1 to 3 including inverse connections 620E-1 to 3, and differential output lines 7E-1 and 7E-2 are the same as those shown in FIG. 8. For an inverter D/A converter, in the case of a highly-accurate D/A converter, since two inverters of positive logic and negative logic are paired and used as a pseudo differential configuration, the inverse connection of the differential outputs can be applied to realize the configuration of the present invention. Consequently, the effect of the present invention can be realized in the same way using this voltage type DAC.

Figure 10:
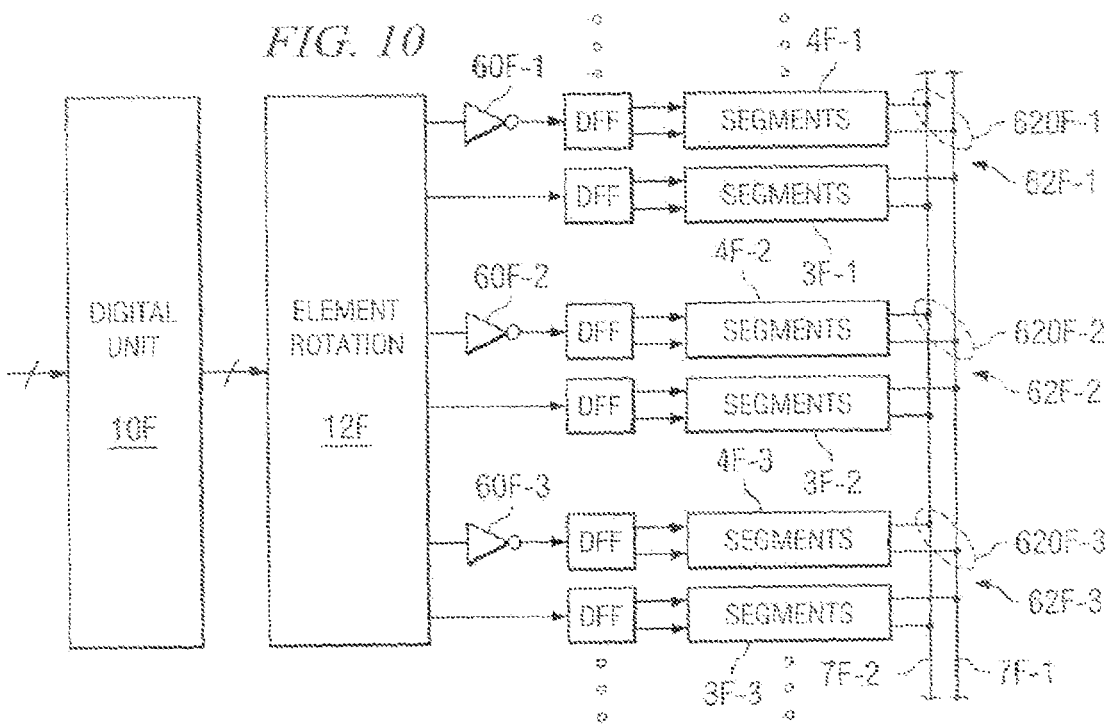
FIG. 10 is a block diagram illustrating segment D/A converter F in an embodiment that adds element rotation to the segment D/A converter shown in FIG. 6.

In the following, segment D/A converter F of an embodiment that adds element rotation to the segment D/A converter shown in FIG. 6 will be explained with reference to FIG. 10. In FIG. 10, the symbol "F" is attached to the same element reference numbers as those used for the elements shown in FIG. 6. The difference from the circuit shown in FIG. 6 is that element rotation circuit 12F is added in the configuration shown in FIG. 10, while digital unit 10F, D-type flip-flops DFF, segments 3F-1 to 3 and 4F-1 to 4, etc., subtracting circuits 62F-1 to 3 including inverse connections 620F-1 to 3, and differential output lines 7F-1 and 7F-2 are the same as those shown in FIG. 6. More specifically, element rotation is known as dynamic element matching. It is a well-known technology for alleviating the problem caused by mismatches between segments used for DAC. Said dynamic element matching is explained in detail in the following references, which are incorporated herein by reference.

1: Rudy J. Van de Plassche, "Dynamic element matching for high-accuracy monolithic D/A converters," IEEE J. Solid-State Circuits, vol. SC-11, pp. 795–800, December 1976.
2: L. Richard Carley, "A noise-shaping coder topology for 15+ bi converters," IEEE J. Solid-State Circuits, vol. SC-24, pp. 267–273, 1989.
3: Bosco H. Leung, "Architectures for multi-bit oversampled A/D converter employing dynamic element matching techniques," IEEE ISCAS 1991, pp. 1657–1660.

The mismatch reducing effect depending on element rotation is realized by averaging the use frequency of each segment. Therefore, in response to a signal received from digital unit 10F, said element rotation circuit 12F selects the segments used for weighting and supplies a signal to these selected segments. When the present invention is applied to the DAC equipped with an element rotation circuit, since the use frequencies of regular segments (such as 3F-1 to 3) and inverted segments (4F-1 to 3) are also averaged, the distortion reducing effect of the present invention can be further improved.

Figure 11:
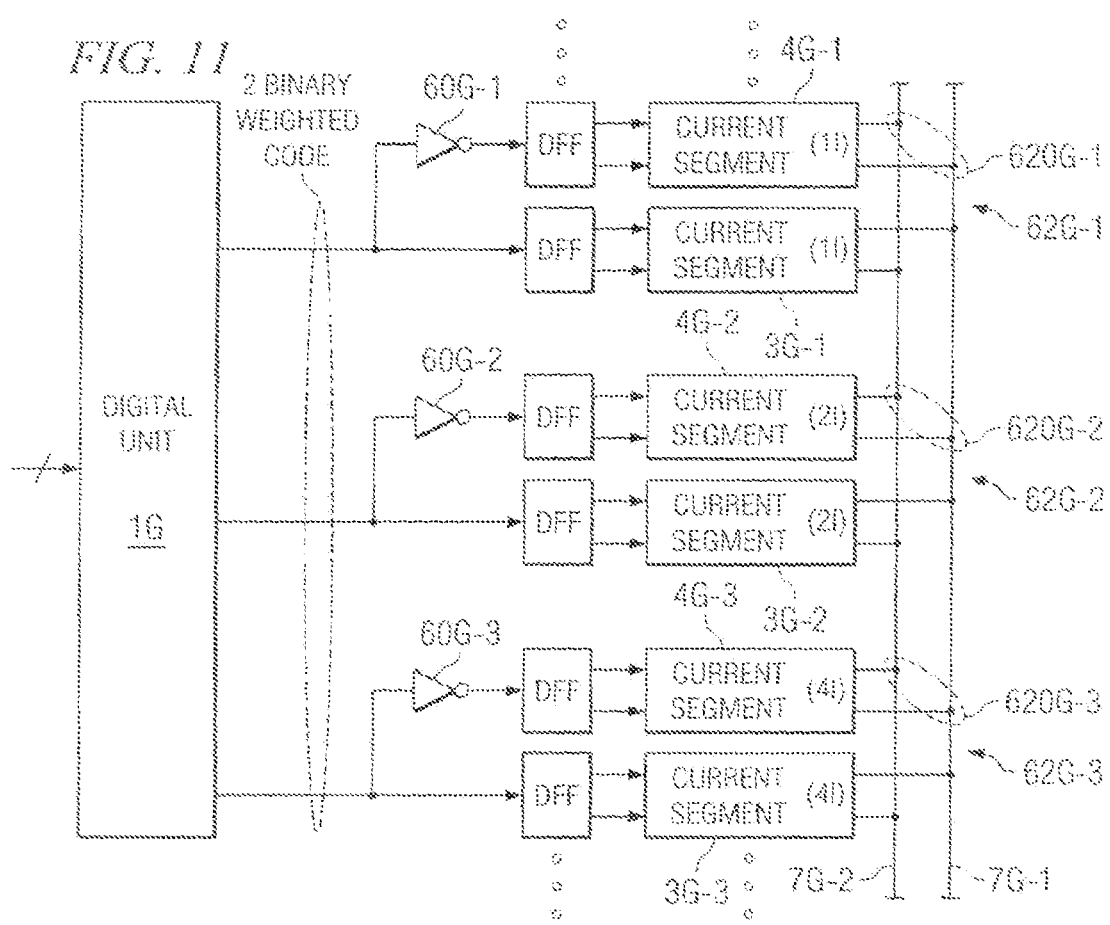
FIG. 11 is a block diagram illustrating binary weighted D/A converter G in an embodiment that applies the present invention to a DAC using nonuniform weighting elements.

In the following, a binary weighted D/A converter (binary weighted DAC) G of an embodiment that applies the present invention to a DAC using nonuniform weighting elements will be explained with reference to FIG. 11. In FIG. 11, the symbol "G" is attached to the same element reference numbers as those used for the elements shown in FIG. 6. The difference from the circuit shown in FIG. 6 is that the signal generated by digital unit 1G shown in FIG. 11 is a binary weighted code instead of a code with uniform weight. Also, the binary weighted D/A converter G disclosed in the present invention is different from the same type of conventional D/A converter in that two differential output current sources (current segments) having 1-times (1I), 2-times (2I), and 4-times (4I) current values (that is, segments 4G-1 and 3G-1, 4G-2 and 3G-2, etc.) are used as 1-times weighting elements, 2-times weighting elements, and 4-times weighting elements, respectively. D-type flip-flop DFF, inverters 60G-1 to 3, etc., subtracting circuits 62G-1 to 3 including inverse connections 620G-1 to 3, and differential output lines 7G-1 and 7G-2 are the same as those shown in FIG. 6. When a pair of segments are used for each weight as described above, the transient response characteristic error can be reduced.

Figure 12:
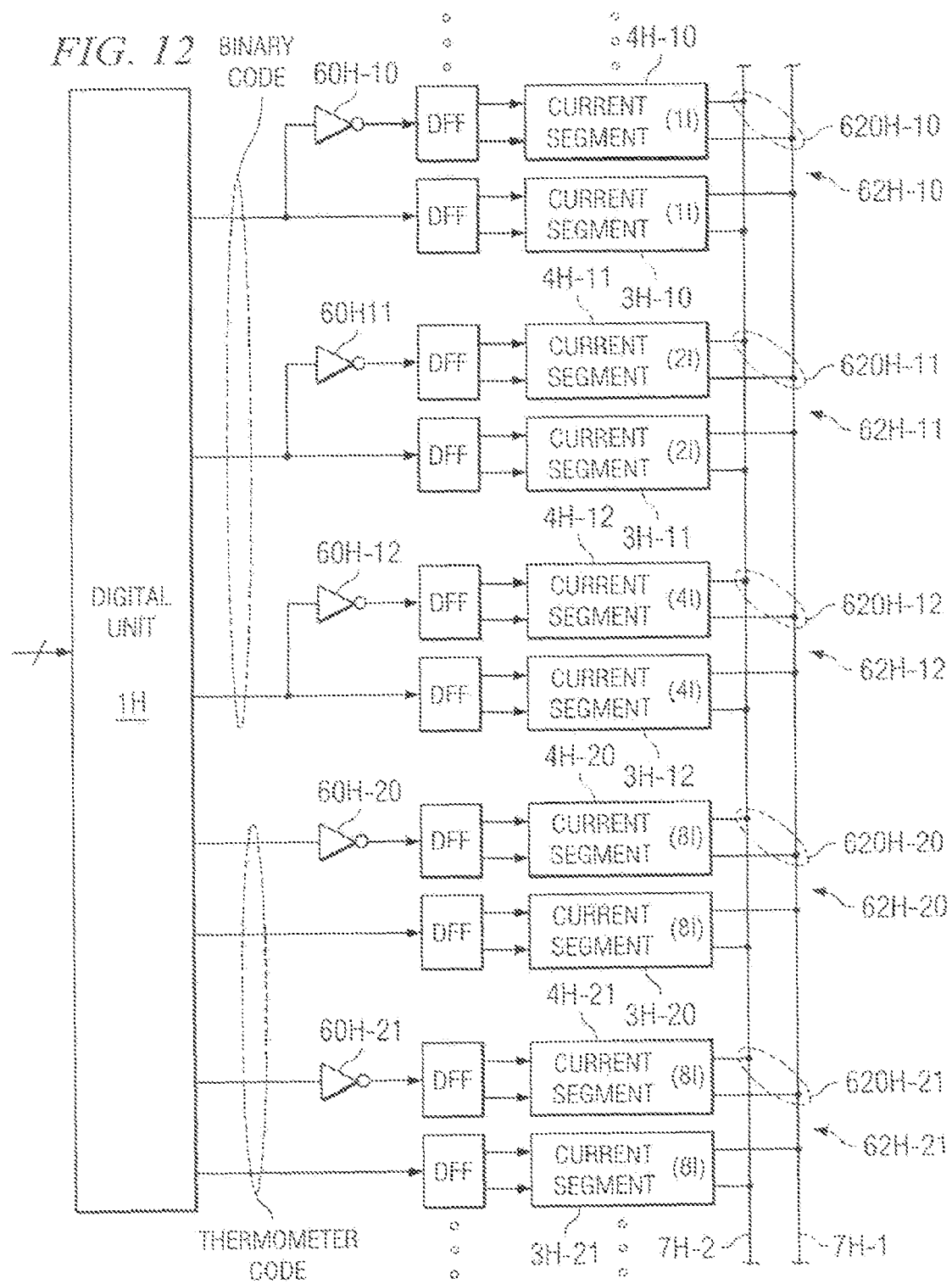
FIG. 12 is a block diagram illustrating partially segmented D/A converter H in an embodiment that applies the present invention to a D/A converter using both uniform weighting elements and nonuniform weighting elements.

In the following, a partially segmented D/A converter H of an embodiment that applies the present invention to a D/A converter using both uniform weighting elements and non-uniform weighting elements will be explained with reference to FIG. 12. Similarly, in FIG. 12, the symbol "H" is attached to the same element reference numbers as those used for the elements shown in FIG. 6. This partially segmented D/A converter H is equivalent to the combination of the current segment D/A converter D shown in FIG. 8 and the binary weighted D/A converter G shown in FIG. 11. In other words, the part that performs the binary code operation requires two current sources (current segments 4H-10 and 3H-10, 4H-11 and 3H-11, 4H-12 and 3H-12, etc.) for each weight in the same way as in the case shown in FIG. 11. On the other hand, the part that operates depending on thermometer code can be constituted by using uniform weight segments (current segments 4H-20 to 21, 3H-20 to 21, etc.) in the same way as in the case shown in FIG. 8. D-type flip-flop DFF, inverters 60H-10 to 12, 60H-20 to 21, etc., subtracting circuits 62H-10 to 12, 62H-20 to 21, including inverse connections 620H-10 to 12, 620H-20 to 21, and differential outputs 7H-1 and 7H-2 are the same as those shown in FIG. 8 or 11. Consequently, when the present invention is applied to this partially segmented DAC, the transient response error can also be reduced.

Embodiments in which the present invention has been applied to a DAC have been explained above. In the following, embodiments in which the present invention is applied to other circuit devices will be explained.

Figure 5:
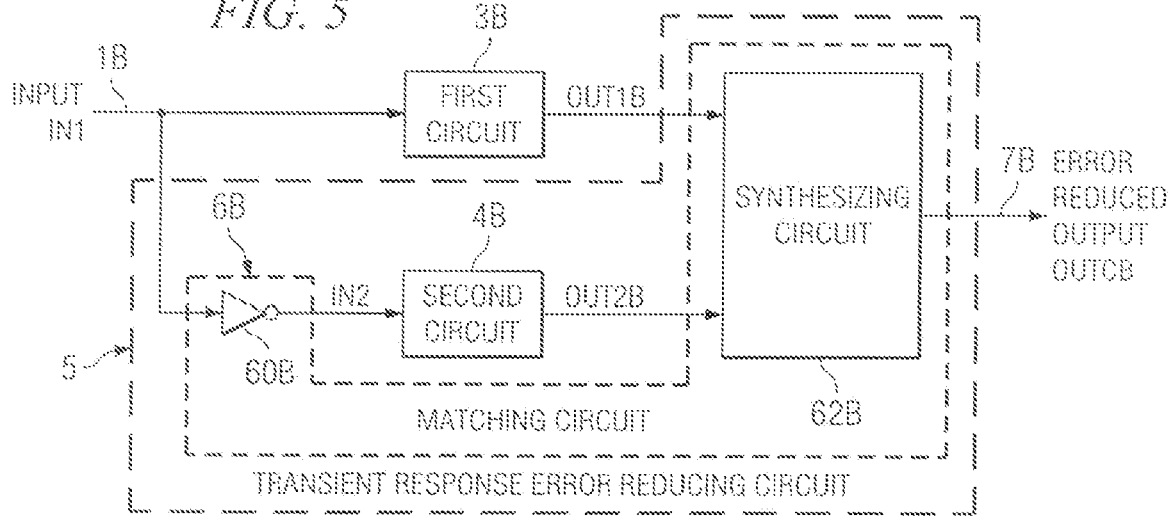
FIG. 5 is a block diagram illustrating the circuit device B in an embodiment of the transient response generating circuit shown in FIG. 3.
Figure 13:
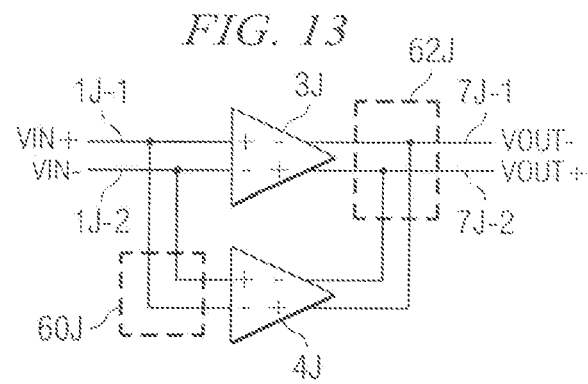
FIG. 13 is a block diagram illustrating op-amp circuit J in an embodiment that further embodies the circuit device shown in FIG. 5.

FIG. 13 shows an op-amp circuit J of an embodiment that further embodies the circuit device shown in FIG. 5. In FIG. 13, the symbol "J" is attached to the same element reference numbers as those used for the elements shown in FIG. 5. The op-amp circuit J shown in the figure has a pair of op-amps 3J and 4J corresponding to the first circuit 3B and second circuit 4B in FIG. 5, and each op-amp has differential inputs and differential outputs. More specifically, a pair of differential input voltages Vin+ and Vin− received at input terminals 1J-1 and 1J-2 are received at the non-inverting input (+) and inverting input (−) of op-amp 3J, and the differential output corresponding to these inputs is generated between the inverting output (−) and non-inverting output (+) of op-amp 3J. Also, the same differential input voltages Vin+ and Vin− are received at the inverting input (−) and non-inverting input (+) of op-amp 4J via inverse connection 60J, and an output corresponding to these inputs is generated between inverting output (−) and non-inverting output (+). The inverting output (−) and non-inverting output (+) of op-amp 4J are connected in opposite polarities to the differential output of op-amp 3J according to inverse connection 62J. In other words, the inverting output (−) of op-amp 4J is connected to non-inverting output (+) of op-amp 3J, and the non-inverting output (+) of op-amp 4J is connected to the inverting output (−) of op-amp 3J. In this way, the difference between the two differential outputs is generated as outputs Vout− and Vout+ at output terminals 7J-1 and 7J-2. Also, inverse connection 60J, op-amp 4J of the secondary circuit, and inverse connection 62J constitute transient response error reducing circuit 5J.

In the op-amp circuit J shown in FIG. 13, the transient response error of op-amp 3J used as the main circuit is reduced by transient response error reducing circuit 4J. In this way, the through rate of the op-amp can be improved. The transient response error of one circuit element in the circuit device can be reduced by arranging that circuit element and another circuit element that is virtually the same or similar as different circuits. Also, in the case of a circuit element having a differential configuration with differential inputs and differential outputs, it is only necessary to make a simple circuit change of inverse connection 60J and inverse connection 62J along with using the added circuit elements. Consequently, the transient response error can be reduced using a very simple method compared with the conventional technology.

Figure 14:
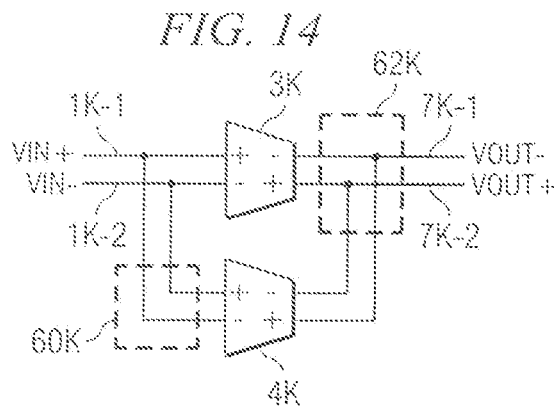
FIG. 14 is a block diagram illustrating OTA circuit K in another embodiment that further embodies the circuit device shown in FIG. 5.

FIG. 14 shows an OTA (operational transconductance amplifier) circuit K of another embodiment that further embodies the circuit device shown in FIG. 5. This OTA circuit K is the same as the op-amp circuit J of generating circuit 3 shown in FIG. 13. The only difference is that OTA 3K and 4K are used instead of the op-amps, while the rest of the configuration (input terminals 1K-1 and 1K-2, inverse connection 60K, inverse connection 62K, output terminals 7K-1 and 7K-2) is exactly the same. Like op-amp circuit J, said OTA circuit K can also improve the through rate by reducing the transient response error of the OTA.

In the following, a charge pump circuit L of an embodiment that further embodies the circuit device shown in FIG. 5 will be explained with reference to FIG. 15. Said charge pump circuit L is used to form an analog signal based on the UP or DOWN signal output from a digital circuit and has a pair of same or different charge pumps 3L and 4L that are connected between power supply voltage VDD and ground GND. This charge pump circuit L is different from the embodiments shown in FIGS. 13 and 14 since it has two pairs of differential inputs, that is, the first pair of differential inputs UP and UP* and the second pair of differential inputs DOWN and DOWN*. These two pairs of differential inputs are connected properly so that each charge pump can receive them. More specifically, charge pump 3L comprises two current sources C1a and C2a and four transistors T1a, T2a, T3a, and T4a. Similarly, charge pump 4L also has two current sources C1b and C2b and four transistors T1b, T2b, T3B, and T4b.

More specifically, inputs UP and UP* with respect to block 3L-1 comprised of current sources C1a, transistors T1a and T2a are also connected to block 4L-1 comprised of current source C1b, transistors T1b and T2b via inverse connection 60L-1. Similarly, inputs DOWN and DOWN* with respect to block 3L-2 comprised of current source C2a, transistors T3a and T4a are also inversely connected to block 4L-2 comprised of current source C2b, transistors T3b and T4b via inverse connection 60L-2. In this way, the inverter 60B shown in FIG. 5 or the inverse connection 60J shown in FIG. 13 is realized. Also, in circuit blocks 3L-1 and 3L-2, T2a and T4a are connected to output 7L, while in circuit blocks 4L-1 and 4L-2, T1b and T3b are connected to output 7L via inverse connection 62L. In this way, the inverse connection 62J shown in FIG. 13 is realized.

The operation of charge pump circuit L will be explained in the following. When input UP is high and DOWN is low, the current from current source C1a flows through T2a and flows to output terminal OUT1. At the same time, the current from current source C1b flows to output terminal OUT2 through T1b. These currents flow to output terminal OUT- PUT. In this case, in each charge pump circuit, if the right side (T2a, T4a, and T2b, T4b) is taken as the positive output and the opposite side (T1a, T3a and T1b, T3b) is taken as the negative output, the rising current of circuit block 3L-1 and the falling current of 4L-1 flow to the output. In this way, the rising response and the falling response occur at the same time. On the other hand, if input UP is low and DOWN is high, current source C2a draws in current from output terminal OUT1 through T4a. At the same time, current source C2b draws in current from output terminal OUT2 through T3b. Therefore, both of these currents are drawn in from output terminal OUTPUT. In this case, the rising response and the falling response also occur at the same time. In this way, the accuracy of the charge pump circuit L to which the present invention is applied can be improved by reducing the transient response error.

Figure 15:
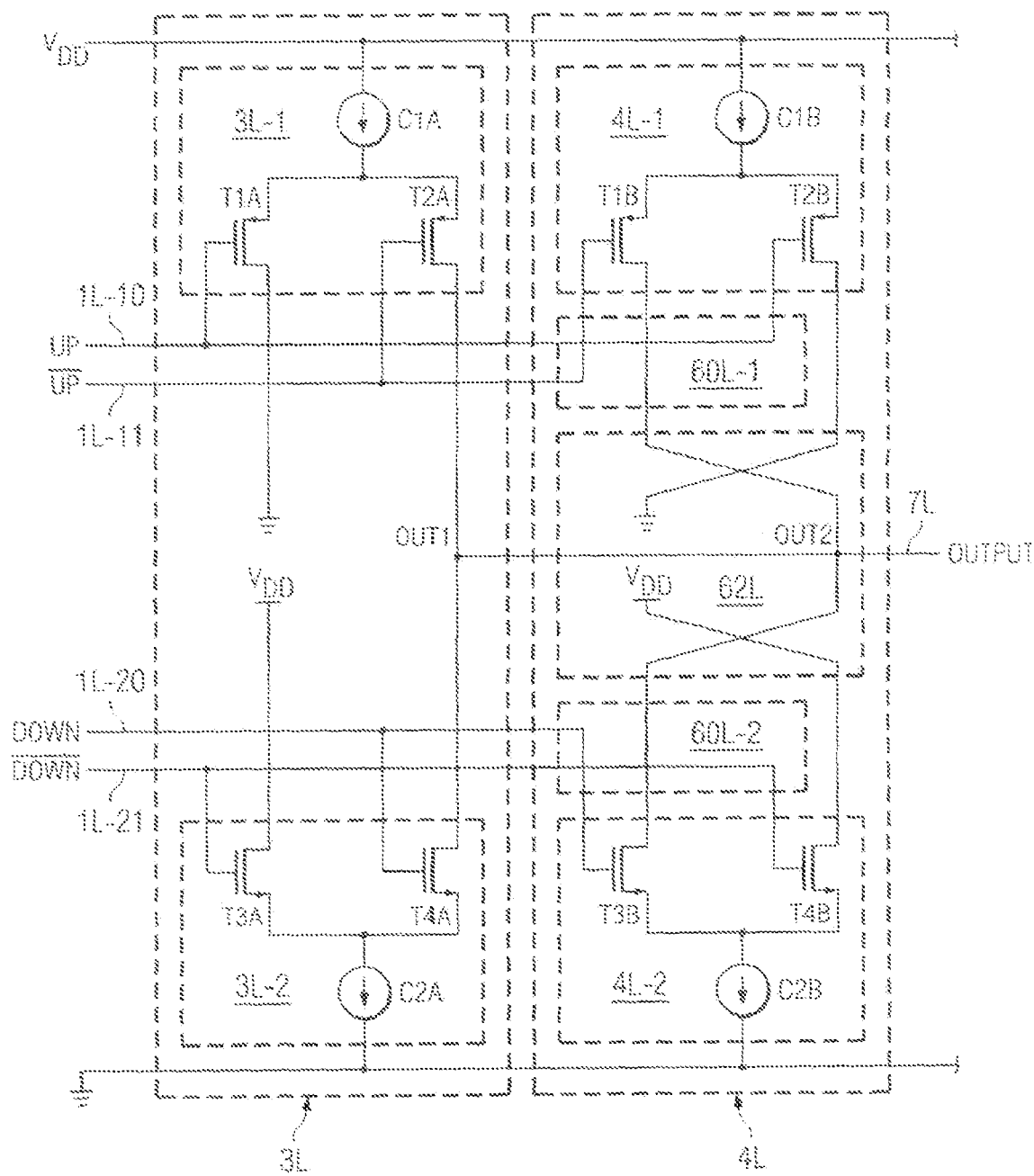
FIG. 15 is a circuit diagram illustrating charge pump circuit L in an embodiment that further embodies the circuit device shown in FIG. 5.

In order to easily explain the relationship of each of charge pumps 3L and 4L shown in FIG. 15 to the circuit shown in FIG. 13, the right side (T2a, T4a, T2b, T4b) is taken as the positive side, while the left side (T1a, T3a, T1b, T3b) is taken as the negative side. However, it is also possible to take the left side as the positive side and the right side as the negative side. Also, in the circuit diagram shown in FIG. 15, in order to increase the degree of matching between 3L and 4L, the left and right arrangement relationship of charge pumps 3L and 4L is preferred to be the same in the actual circuit arrangement, for example, the arrangement of circuits assembled on IC. However, since this circuit diagram and the actual circuit arrangement are not necessarily the same, it is also possible to reverse the left and right arrangement relationship of 3L and 4L. In this case, a certain degree of circuit matching can also be realized. Consequently, either the circuit part on the left side or right side can be taken as the positive side. Once the positive side and negative side are determined, that is, once the positive input/negative input and positive output/negative output are determined, the transient response error can be reduced by applying the present invention to the circuit having the aforementioned different inputs/differential outputs. The way of determining the positive side and negative side of the differential circuit and the arrangement relationship between the circuit diagram and the actual circuit arrangement are the same not only for the embodiments shown in FIGS. 13 and 14 but also for the embodiments shown in FIG. 6, FIGS. 8–12 and the embodiment shown in FIG. 16 to be explained below.

Figure 16:
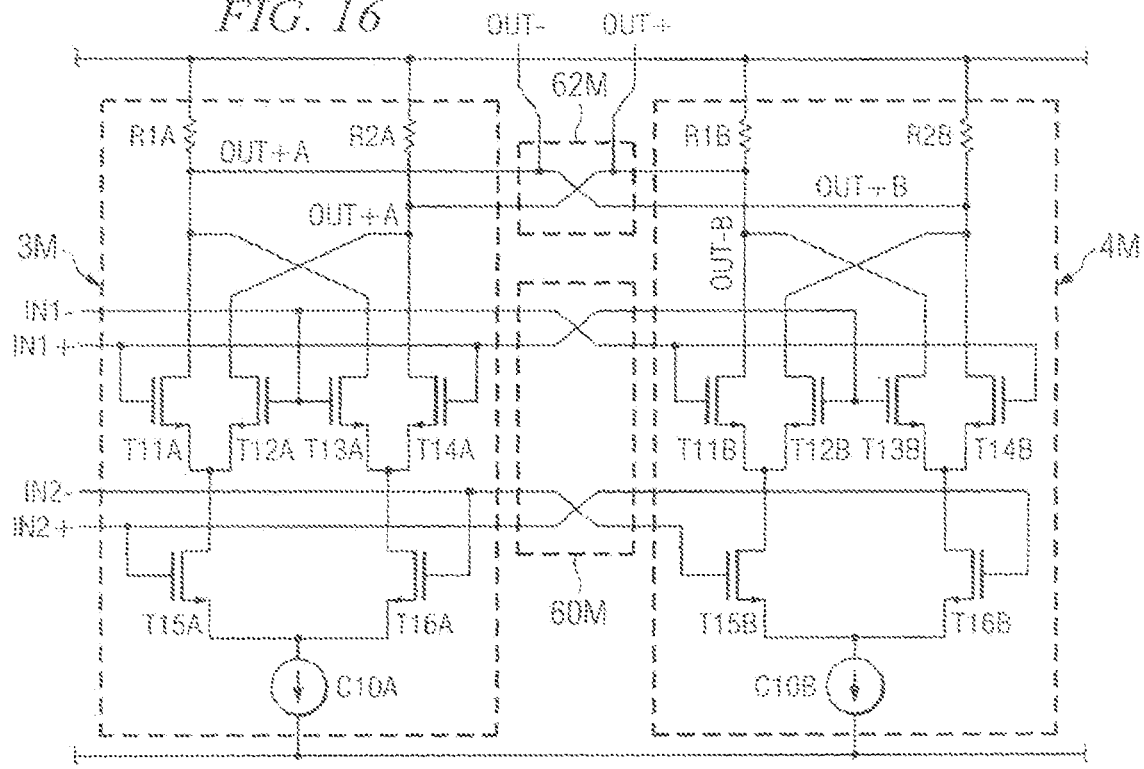
FIG. 16 is a circuit diagram illustrating Gilbert mixer circuit M in another embodiment that further embodies the circuit device shown in FIG. 5.

Finally, a Gilbert mixer circuit M of another embodiment that further embodies the circuit device shown in FIG. 5 will be explained with reference to FIG. 16. This circuit has a pair of same conventional Gilbert mixers 3M and 4M connected between the power supply voltage and the ground. Each mixer has two pairs of differential inputs, that is, inputs IN1− and IN1+ and inputs IN2− and IN2+. This mixer generates an output obtained by mixing said two differential inputs between differential outputs OUT− and OUT+.

More specifically, mixer 3M has a conventional circuit configuration comprised of current source C10a, three pairs of differential pairs constituted with three pairs of transistors T11a and T12a, T13a and T14a, T15a and T16a, and two resistors R1a and R2a. Mixer 4M also has current source C10b, three differential pairs constituted with three pairs of transistors T11b and T12b, T13b and T14b, T15b and T16b, and two resistors R1b and R2b. As shown in the figure, input IN1− is connected to two transistors T12a and T13a on the inside in mixer 3M, and is connected to transistors T11b and T14b on the outside by inverse connection 60M in mixer 4M. Connection is made in opposite polarities. Input IN1+ is connected in the opposite manner. However, connection is also made in opposite polarities in mixers 3M and 4M. This is also true for inputs IN2− and IN2+. Inverse connection 60J shown in FIG. 13 is constituted in this way. On the other hand, the lower output OUT−a of R1a in mixer 3M is connected to output terminal OUT− together with the lower output OUT+b of R2b in mixer 4M. The lower output OUT+a of R2a in mixer 3M is connected to output terminal OUT+ together with the lower output OUT−b of R1b in mixer 4M. In part 62M where this output is connected inversely, the inverse connection 62J shown in FIG. 13 is realized. In this way, a highly-accurate mixer can be realized by applying the present invention to the Gilbert mixer circuit M.

The present invention has been explained in detail based on various types of embodiments. It will be clear to those who are skilled in this field that each of the aforementioned embodiments is only one example, and the present invention can also be applied to other types of circuits. Also, circuits with a differential configuration are explained in detail in the aforementioned embodiments. The present invention, however, can be applied to single-ended circuits in the same way. In this case, an inverter and a differential circuit are used instead of the inverse connection in the differential configuration. The present invention can be applied not only to small-scale circuits but also to large-scale circuits of any size. Also, as described above, even if the first circuit 3B and the second circuit 4B shown in FIG. 5 do not exactly match, an effect corresponding to the degree of matching can be realized by applying the present invention. These changes and modifications can be made in the invention without departing from the spirit and scope of the invention as defined by the appended claims.

The invention claimed is:

1. A transient response generating circuit comprising:
a first circuit that generates the transient response in a first polarity direction;
a second circuit that generates the transient response in a second polarity direction opposite to the aforementioned first polarity;
and a transient response synthesizing circuit that combines the transient responses in the first and second polarity directions to generate a composite transient response, wherein the first circuit that receives a first input and generates a first output;
the second circuit that receives a second input formed by inverting the first input and generates a second output, this second circuit being substantially equivalent to the first circuit; and
the transient response synthesizing circuit comprises a subtracting circuit that calculates the difference between the first and second outputs.

2. A circuit device comprising:
a) a first circuit which is a first circuit generating a first output in response to a first input with the first output having prescribed transient response characteristics in a first polarity direction and a second polarity direction,
b) an error reducing circuit that reduces the transient response error in the first output of the first circuit to generate an error-reduced output wherein the circuit device constitutes any two weighting elements among the plural weighting elements in a D/A converter; and the first circuit and a second circuit constitute the weighting circuit of each of the weighting elements.

3. The circuit device described in claim 2 wherein the transient response characteristics in the first and second polarity directions of the error-reduced output are substantially equivalent to each other.

4. A D/A converter according to claim 3 wherein the D/A converter comprises:
   a) the plural weighting elements used for converting a digital signal into an analog signal;
   b) a digital processing circuit that generates plural binary signals to be applied to the plural weighting elements from the digital signal;
   any two the plural weighting elements is comprised of the circuit device according to claim 3.

5. The circuit device described in claim 2 wherein the error reducing circuit is connected properly to receive the first input and first output of the first circuit.

6. The circuit device described in claim 2 wherein the circuit device has a differential circuit configuration or a single-ended circuit configuration.

7. A D/A converter according to claim 2 wherein the D/A converter comprises:
   a) the plural weighting elements used for converting a digital signal into an analog signal,
   b) a digital processing circuit that generates plural binary signals to be applied to the plural weighting elements from the digital signal.

8. A D/A converter according to claim 7, wherein the D/A converter uses weights of the same magnitude; and
   each of the plural weighting elements of the D/A converter generates the weight of the same magnitude.

9. The D/A converter according to claim 7 wherein the D/A converter uses weights of different magnitudes; and
   the plural weighting elements of the D/A converter include plural weighting elements with respect to each of the weights.

10. A circuit device comprising:
   a) a first circuit which is a first circuit generating a first output in response to a first input with the first output having prescribed transient response characteristics in a first polarity direction and a second polarity direction,
   b) an error reducing circuit that reduces the transient response error in the first output of the first circuit to generate an error-reduced output, wherein the circuit device constitutes one of plural weighting elements in a D/A converter; and
   the first circuit and a second circuit constitute the weighting circuit of each of the a weighting elements.

* * * * *